United States Patent [19]

Hanak

[11] Patent Number: 4,514,579

[45] Date of Patent: Apr. 30, 1985

[54] LARGE AREA PHOTOVOLTAIC CELL AND METHOD FOR PRODUCING SAME

[75] Inventor: Joseph J. Hanak, Lawrenceville, N.J.

[73] Assignee: Energy Conversion Devices, Inc., Troy, Mich.

[21] Appl. No.: 575,373

[22] Filed: Jan. 30, 1984

[51] Int. Cl.³ .................. H01L 31/06; H01L 31/18
[52] U.S. Cl. .................................. 136/249; 29/572; 29/588; 136/244; 136/251; 136/258; 357/30; 357/45
[58] Field of Search .......... 136/244, 249 MS, 249 TJ, 136/258 AM, 251; 357/30, 45; 29/572, 588; 427/74

[56] References Cited

U.S. PATENT DOCUMENTS 4,281,208  7/1981  Kuwano et al. ................. 136/249
4,315,096  2/1982  Tyan et al. ...................... 136/244

Primary Examiner—Aaron Weisstuch
Attorney, Agent, or Firm—Marvin S. Siskind; Ronald W. Citkowski

[57] ABSTRACT

A large area photovoltaic cell tolerant of puncture damage to small area segments thereof, and exhibiting only a proportional loss of electrical output from low resistance current paths formed through those small area segments. The small area segments are arrayed in a plurality of rows and columns upon an electrically insulating substrate. The small area segments in each of the rows or columns are electrically connected in series, while the series connected rows or columns of small area segments are electrically connected in parallel. The large area cell also includes a pressurized sealant which is released when the surface of the cell is pierced. The sealant flows through the damaged portion and protects the edges thereof from degradation by ambient conditions. Also disclosed is a method for the manufacture of such defect-tolerant large area photovoltaic cells.

15 Claims, 5 Drawing Figures

LARGE AREA PHOTOVOLTAIC CELL AND METHOD FOR PRODUCING SAME

FIELD OF THE INVENTION

This invention relates generally to photovoltaic devices and more particularly to large area photovoltaic cells which are divided into a plurality of small area photovoltaic segments. The invention specifically relates to a large area photovoltaic cell which is uniquely resistant to puncture damage and very tolerant of low resistance current paths, as well as to a method of making such a cell.

BACKGROUND OF THE INVENTION

This invention relates to a large area photovoltaic device, such as a solar cell, configured so as to provide a consistently high level of performance despite the presence of shorts and shunts which may occur to the cell during processing, handling or use. Generally, the invention contemplates the concept of dividing the large area cell into a plurality of groups of discrete, isolated, series-connected, small area photovoltaic segments, which groups are then electrically connected in parallel. In this manner defects in, or damage to, a given small area segment of the large area photovoltaic cell will not result in a disproportionate loss in the electrical performance of the large area cell, since the effect of the defect or damage will be restricted to the discrete small area segment in which it occurs. The loss of electrical performance in a series-parallel connected large area cell will only be fractional and proportional to the loss in surface area of the damaged small area segment. The invention includes a method for the manufacture of these large area photovoltaic cells from deposited thin film layers of semiconductor material, said method of manufacture being readily adaptable to a continuous process.

Owing to the increasing world demand for energy and the decreasing availability of nonrenewable energy sources such as fossil fuels, photovoltaic power has become increasingly attractive. Initially, sources of photovoltaic power were restricted to single crystal photovoltaic materials, which materials are difficult to fabricate, expensive to manufacture and of limited size. Consequently, crystalline photovoltaic materials are of limited utility for general power generating applications. Recently, a number of technologies have been developed for manufacturing thin film photovoltaic devices from such materials as cadmium sulfide, cadmium telluride, gallium arsenide, gallium aluminum arsenide, amorphous silicon alloys, amorphous germanium alloys and the like.

Because of their economical manufacture and ease of processing, thin film materials are replacing single crystal materials in photovoltaic applications. Thin film photovoltaic cells generally cost far less to produce than single crystal cells. Single crystal materials must be grown by a time consuming, energy intensive process, whereas thin film materials may be rapidly and economically deposited via vacuum deposition processes, plating processes, chemical vapor deposition processes and the like. Furthermore, the process of fabricating single crystal photovoltaic cells is wasteful of material, i.e., before the cells can be utilized, large single crystal ignots must be physically cut into wafers. In contrast thereto, thin film photovoltaic materials may be directly deposited onto a substrate, so as to form a photovoltaic cell, in a deposition process which fully utilizes all of the deposited semiconductor material. The flexibility of thin film photovoltaic materials is another reason that such materials are very attractive for use in photovoltaic cells. These materials may readily be configured to cover large areas, whereas single crystal materials such as silicon can only be grown into 6 inch diameter wafers. And since, thin film materials are flexible, photovoltaic cells capable of conforming to a variety of geometries may be manufactured. As is obvious from the foregoing, photovoltaic energy sources are of increasing importance, and thin film photovoltaic cells have unique properties making them specially suited for the economical, wide-spread generation of electrical power.

The active semiconductor layers of thin film photovoltaic cells are, by definition, quite thin, i.e., approximately several hundred to several thousand angstroms thick. While the materials utilized in thin film, large area photovoltaic devices, especially amorphous silicon alloy materials, are quite durable, the extreme thinness thereof may make small area segments of the large area device susceptible to damage such as the formation of low resistance current paths, which, in the absence of proper photovoltaic device design, could disproportionately reduce the performance of the large area device.

Defects in a thin film device can take the form of shorts or shunts which, as mentioned, provide a low resistance current path through the thin film semiconductor material. As is well known to those skilled in the art, even a small number of such low resistance current paths can effectively short circuit an entire photovoltaic cell, thereby degrading or destroying its electrical performance. Shorts and shunts can arise during the fabrication of a photovoltaic cell if, for example, (1) a defect such as a jagged spike or protuberance is present upon the surface of the substrate atop of which the thin film layer of semiconductor material is deposited, or (2) if the deposited thin film layer does not completely cover the substrate layer therebelow. While it may be theoretically possible to eliminate all low resistance current paths during processing, the economics and realities of producing defect-free large area photovoltaic devices demands the manufacture of a large area device which is tolerant of such defects. Furthermore, low resistance current paths occurring after manufacture of the photovoltaic device will also deleteriously affect the performance of that device if the device is not defect-tolerant. Additionally, note that damage may occur to the small area segments of the large area photovoltaic device while in situ, if, per chance, they are punctured by hail, rocks, bullets, or other projectiles. While projectile impact is likely to shatter a single crystal photovoltaic device, thereby rendering it inoperative, damage to thin film photovoltaic devices will generally be limited to a puncture in a small area segment thereof. In some cases the puncture will cause no damage whatsoever, in other cases it may create a low resistance current path, either immediately, or over a course of time owing to degradation at the puncture site by the action of moisture and oxygen. Obviously, it is highly desirable to have a photovoltaic cell which is (1) insensitive to, or tolerant of, the effects of low resistance current paths, and (2) resistant to puncture damage.

As discussed hereinafter, the effects of shorts and shunts may be mitigated or intensified, depending upon the current collection design of the large area device. More particularly, if a large area semiconductor body was designated to form a single, unsegmented large area photovoltaic cell, the presence of a single low resistance current path could disproportionately destroy the electrical output of the entire large area cell. Obviously, the probability of damaging the entire electrical output of a large area segmented photovoltaic cell is dependent upon the surface area of that large area cell, the number of small area segments into which it is divided, and the manner in which those small area segments are electrically connected. It is for this reason that large area photovoltaic cells are divided into a plurality of small area segments. It is to be noted at this point that the term "cell", as used herein, will refer to a unitary, photovoltaic device disposed upon a single discrete substrate. A large area cell may therefore include a plurality of electrically interconnected, small area photovoltaic segments, each capable of producing an electrical current in response to illumination, said small area segments cooperating to provide the total electrical output of the large area photovoltaic cell. The term "photovoltaic segment", as used herein, will refer to one of the small area subcells, or individual subunits into which the large area photovoltaic cell is divided.

If the small area segments into which the large area photovoltaic cell may be subdivided are electrically connected in series, the sum of the voltages of the individual small area segments produce the voltage of the large area photovoltaic cell. In such a series connected arrangement of small area segments, an individual shorted or shunted segment will not necessarily destroy the operation of the entire large area cell since electrical current will merely flow through the low resistance current path to the next series connected small area segment. The utility of dividing a large area cell into a plurality of series connected small area segments is limited by the fact that the voltage is additive. The voltage of the series connected small area segments is dependent upon the number of functioning small area segments of the large area cell. If a large number of small area segments are inoperative, the sum of the voltages of the entire large area cell may be severely reduced. Furthermore, since the output voltage of a large area photovoltaic cell having series connected small area segments is dependent upon the number of operative small area segments, damage occurring after the large area cell is installed may also cause severe voltage loss in that large area cell. A large area photovoltaic cell which is divided into a very large number of series electrically interconnected small area segments will not have its output voltage changed significantly by the loss of a few segments; however such a device would exhibit a high output voltage and a low output current, and thereby be of limited utility.

The use of parallel connected small area segments is an alternative approach to the division of a large area photovoltaic cell into a plurality of small area segments, which connection will prevent a small number of defective portions thereof from destroying the electrical output of the entire cell. A parallel connected array of small area photovoltaic segments will provide a relatively high output current at a voltage equivalent to that of a single small area segment, i.e. the photogenerated currents of the plurality of small area segments are additive. The use of a parallel connected array of small area segments therefore offers the advantage of a high output current. However, a major problem exists with utilizing a parallel connected array of small area segments because a single shorted or shunted small area photovoltaic segment can effectively short circuit the entire large area photovoltaic cell by providing a low resistance current path in parallel with the small area segments.

One solution to the problem of having defective small area segments in a parallel connected array of those small area photovoltaic segments, into which a large area solar cell is divided, destroy the electrical output of that entire large area cell is disclosed in U.S. Pat. No. 4,419,530 of Prem Nath, entitled IMPROVED SOLAR CELL AND METHOD FOR PRODUCING SAME, which patent is assigned to the assignee of the instant invention and the disclosure of which is incorporated herein by reference. The method described by the Nath patent includes the steps of subdividing a large area photovoltaic device into a plurality of discrete, electrically isolated small area photovoltaic segments and electrically connecting, in parallel, only those small area segments found to be electrically operable (i.e. free of defects and capable of producing an adequate electrical output). The Nath invention is therefore capable of reducing electrical power losses normally experienced when individual small area segments of a large area photovoltaic cell are defective. However, subsequent damage to one or more of the small area segments of the large area photovoltiac cell, which damage can short circuit the small area segment, will still detrimentally affect the performance of the entire large area photovoltaic cell. Furthermore, the method disclosed by Nath, requires the individual testing of each small area segment before it is incorporated into the parallel connected array which defines the large area cell. Obviously, such a testing procedure is time and labor intensive, and represents an additional expense in the fabrication of large area, thin film photovoltaic cells. Accordingly, the need still exists for a thin film, large area photovoltaic cell having an electrical output which is insensitive to the effects of low resistance current paths and/or other damage occurring either prior to, during, or after cell fabrication.

A combined series-parallel array of small area photovoltaic segments has previously been employed to form a thin film, large area photovoltaic cell, thereby overcoming the problems previously discussed with reference to series connected and to parallel connected small area segments thereof. According to known principles, a plurality of small area photovoltaic segments may be arrayed in rows and columns upon a substrate. The small area photovoltaic segments within each given row are electrically connected in series so as to form a series connected row, and those series connected rows are then electrically connected in parallel, thereby forming the large area photovoltaic cell. It should be noted that the terms "rows" and "columns" as used herein, will designate subgroups of the small area segments within the matrix array of the small area segments which combine to form the large area photovoltaic cell. The term "rows" and "columns" as used herein include any grouping of adjacent small area segments, and accordingly may be used interchangably; for example, the series connected segments may be described as series connected rows or series connected columns. However, solely for the sake of consistency and clarity, the series connected small area segments will be described in this specification as being aligned in parallel rows, it being understood that they could equally well be described as being aligned in columns. Furthermore, it is not necessary that the rows and columns be oriented at right angles to one another; other arrangements such as diagonal arrangements may be similarly employed. In summary, the series-parallel arrangement is defined to include groups of series connected photovoltaic segments, generally referred to herein as rows, which rows are then electrically connected in parallel.

It should thus be apparent that the output voltage of a series-parallel arrangement of the small area segments of a large area photovoltaic cell will be determined by the voltage produced in each series connected row, while the total output current will be determined by the sum of the current produced by each of the parallel connected rows. Thus as is also readily apparent, the electrical characteristics of a large area photovoltaic cell may be selected by choosing the appropriate series-parallel arrangement of the small area segments thereof.

The importance of such a series-parallel connected large area photovoltaic cell is that it is resistant to the effects of shorts, shunts, low resistance current paths and other mechanical damage to individual small area segments. For example, if an individual small area segment develops a current shunting type of defect, it will create a low resistance current path between the two adjacent small area segments with which it is electrically connected in series. Such current shunting defect will not short circuit current from the entire large area cell as would be the case if the small area segments were connected in parallel. Although the single defective small area segment will proportionally lower the output voltage of the row of small area segments with which it is connected in series, the effect of the single defective small area segment upon the total voltage output of the large area photovoltaic cell will be negligible since there are a plurality of rows of such series connected small area segments, the rows connected in parallel. Therefore, the fractional loss in electrical performance exhibited by the large area photovoltaic cell will be equal to the number of current shunting small area segments divided by the total number of small area segments into which the large area photovoltaic cell is divided. On the other hand, damage to a small area segment of the large area photovoltaic cell which results in a complete loss of the electrical output of that small area segment (i.e. an "open circuit" rather than a short circuit), destroys the electrical output of the entire row in which that small area segment is electrically connected in series, but does not (1) impair the electrical operation of the remaining rows of small area segments of the large area cell, or (2) lower the operating voltage of the large area cell. In contradistinction, a completely series connected array of small area segments, in which an open circuit condition exists, renders the large area photovoltaic cell inoperative. According to the principles of this invention, the individual small area segments may be fashioned of such a small size that the need for grid patterns thereon is obviated since the current path across any given small area segment is quite short. It should thus be apparent from the foregoing description that the utilization of a series-parallel arrangement of small area segments in the fabrication of large area photovoltaic cells is desirable.

U.S. Pat. Ser. No. 4,315,096 of Tyan, et al, entitled INTEGRATED ARRAY OF PHOTOVOLTAIC CELLS HAVING MINIMIZED SHORTING LOSSES, discloses one such series-parallel connected array of small area segments of a large area photovoltaic cell, said cell formed by a plurality of discrete semiconductor members, the number of which corresponding to the number of small area photovoltaic segments into which the large area cell is divided. The semiconductor members are electrically connected by electrodes which are configured to form the preselected series-parallel arrangement. While Tyan, et al, provides a series-parallel connected large area photovoltaic cell, the method disclosed therein is cumbersome insofar as it necessitates the use of a large number of discrete semiconductor members which must be either individually deposited by a series of masking and deposition steps, or formed from a continuous layer of semiconductor material which is subsequently scribed. It should also be noted that Tyan et al., offers no solution to the problems (they do not even acknowledge the existence of the problems) resulting from puncture damage to the large area photovoltaic cell after installation. Even if the large area cell enjoys a series-parallel arrangement of small area segments, the effects of such damage on overall cell performance may be severe if oxygen and moisture from the ambient atmosphere enter and corrode portions of the large area cell. Obviously, it is desirable to eliminate the steps disclosed and required by the method of Tyan et al in order to effect their series-parallel electrical connection, and thereby effect savings in time and cost. Furthermore, there still exists a need for a large area photovoltaic cell capable of sustaining puncture damage without severely and deleteriously affecting the overall electrical output of that cell.

The instant invention provides a large area photovoltaic cell divided into a series-parallel connected array of small area photovoltaic segments, and a method of fabricating such a large area cell. The large area cell, so fabricated, does not require the use of individual semiconductor members to form each of the small area segments, but rather, a single elongated semiconductor member or "bridge" electrically contacts a plurality of electrode members within a given column. In this manner, the number of semiconductor bridges utilized to fabricate the large area photovoltaic cell is reduced, the number of semiconductor bridges being equal to the number of small area photovoltaic segments within a given row. The improved large area photovoltaic cell design, described herein, results in a savings in the number of processing steps, of processing time, and cost, and reduces the likelihood of damage to the small area segments during the electrical connection thereof. The instant invention also provides a large area photovoltaic cell capable of sealing punctures resulting from the impact of projectiles which might occur after installation, so as to prevent degradation of the exposed semiconductor material due to exposure to ambient conditions. The instant invention thereby significantly reduces problems which have heretofore limited the efficient and widespread use of thin film, large area photovoltaic devices.

It should therefore be apparent that the instant invention is well suited for use with any type of thin film photovoltaic device, and has special utility in the fabrication of thin film, large area photovoltaic cells which incorporate amorphous semiconductor alloy layers.

Recently, considerable efforts have been made to develop systems for depositing amorphous semiconductor alloy materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions.

It is now possible to prepare amorphous silicon alloys by glow discharge deposition or vacuum deposition techniques, said alloys possessing (1) acceptable concentrations of localized states in the energy gaps thereof, and (2) high quality electronic properties. Such techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374 of Stanford R. Ovshinsky and Masatsugu Izu, which issued on Aug. 12, 1980, also entitled Amorphous Semiconductors Equivalent To Crystalline Semiconductors; and U.S. patent application Ser. No. 423,424 of Stanford R. Ovshinsky, David D. Allred, Lee Walter, and Stephen J. Hudgens entitled Method Of Making Amorphous Semiconductor Alloys And Devices Using Microwave Energy. As disclosed in these patents and application, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E.D. Jackson in U.S. Pat. No. 2,949,498 issued Aug. 16, 1960. The multiple cell structures therein discussed utilized p-n junction crystalline semiconductor devices. Essentially, the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in U.S. Pat. No. 4,400,409 for a Method of Making P-Doped Silicon Films; U.S. Pat. No. 4,410,588 for Continuous Amorphous Solar Cell Production System, and in pending patent applications: Ser. No. 244,386, filed Mar. 16, 1981, for Continuous Systems For Depositing Amorphous Semiconductor Material; U.S. Pat. No. 4,438,723, for Multiple Chamber Deposition And Isolation System And Method; U.S. Pat. No. 4,492,181, for Method And Apparatus For Continuously Producing Tandem Amorphous Photovoltaic Cells; and U.S. Pat. No. 4,485,125, for Method And Apparatus For Continuously Producing Tandem Amorphous Photovoltaic Cells. As disclosed in these patents and patent applications, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained. It is for the production of large area photovoltaic cells fabricated from the materials and by the processes enumerated hereinabove, that the series-parallel connections including semiconductor bridging of the small area segments described by the instant invention may be utilized. Employing the techniques referred to in the patents and applications referenced above, and the teachings of the instant invention, a novel, continuous process for the manufacture of improved, damage resistant, large area photovoltaic cells is disclosed.

BRIEF SUMMARY OF THE INVENTION

There is disclosed herein an improved large area photovoltaic cell and the method of manufacturing same. The large area cell is formed of a plurality of rows and a plurality of columns of discrete small area photovoltaic segments disposed upon an electrically insulating substrate. The individual small area segments of one of each row or column are electrically connected in series, and the series-connected one of the rows and columns are electrically connected in parallel, thereby forming a series-parallel connected large area photovoltaic cell which exhibits only proportional losses in electrical output resulting from the failure of one or more discrete small area segments thereof.

The large area photovoltaic cell includes, more specifically, a plurality of discrete, first, small area electrodes electrically isolated from one another, and disposed so as to form a plurality of rows and a plurality of columns upon the insulating substrate. Each first electrode has a surface which is divided into a major portion adapted for the deposition of semiconductor material thereupon, and a minor portion adapted to electrically contact a second electrode. The large area cell further includes a discontinuous layer of semiconductor material which is adapted to generate an electrical current upon illumination. The semiconductor material bridges the major portions of at least two adjacent first electrodes in a given column. Disposed atop the semiconductor material is a plurality of discrete, small area second electrodes, equal in number to, and generally overlying the minor portions of adjacent first electrodes. In this manner, the rows and columns of small area segments of the large area photovoltaic device are series-parallel connected.

The large area photovoltaic cell may also include a pressurized layer of semi-solid sealant material, such as a silicone compound, disposed immediately beneath the electrically insulating substrate. Puncture or other mechanical damage to the large area cell releases the sealant, which in turn, flows into the damaged area, and protects the punctured edges thereof from ambient conditions. Further, the improved large area photovoltaic cell of the instant invention is readily adapted for manufacture in a continuous glow discharge deposition process.

DETAILED DESCRIPTION OF THE DRAWINGS

I. The Small Area Photovoltaic Segment

Figure 1:
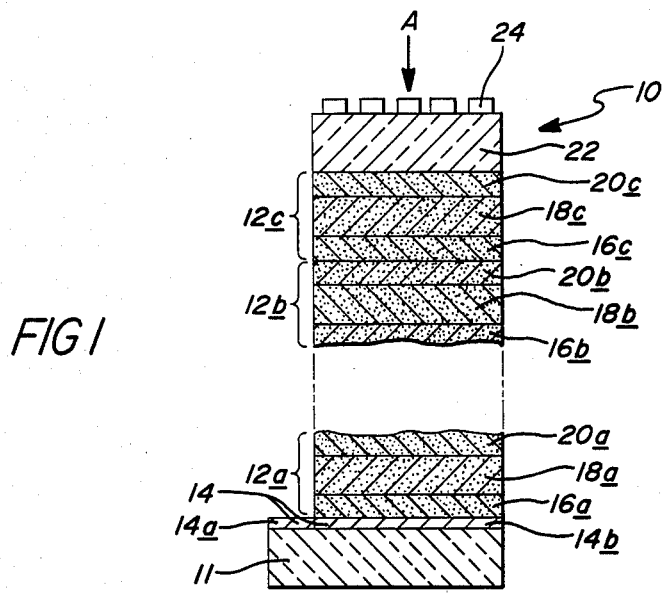
FIG. 1 depicts a cross-sectional, fragmentary view of a small area photovoltaic segment fabricated in accordance with the principles of the instant invention, and including an insulating substrate, first and second electrodes, a plurality of p-i-n semiconductor layers, a transparent conductive oxide layer and a grid.

Referring now to the drawings and particularly to FIG. 1, there is illustrated a small area photovoltaic segment 10 formed of a substrate 11, a first electrode 14, a plurality of successively deposited p-i-n semiconductor alloy layers 12, a transparent conductive oxide second electrode 22, and a grid pattern 24. It is small area segments of this type which, according to the teaching of the instant invention, may be interconnected to form an improved large area photovoltaic cell.

More particularly, FIG. 1 shows a typical p-i-n type small area photovoltaic segment made up of individual p-i-n type sub-cells 12a, 12b and 12c. Below the lowermost sub-cell 12a is an electrically insulating substrate 11, which provides support to, and electrically isolates the small area segment 10 from the adjacent small area segments into which the large area photovoltaic cell is divided. The substrate 11 must have at least one electrically insulating surface upon which the layers which combine to form the small area segment 10 are disposed. Accordingly, the substrate may be formed from (1) materials such as glass, organic polymers such as polyesters, polyimides, vinyls, or (2) electrically conductive materials upon which an insulating layer is formed. One substrate material having particular utility in the practice of the instant invention is 2 to 5 mil thick stainless steel upon which an insulating polyimide coating of at least 1 micron thickness is applied. Other substrate materials may be used without departing from the spirit or scope of the instant invention provided only that they (1) have at least one electrically insulating surface, and (2) be capable of providing dimensional support and stability to the photovoltaic segments subsequently formed thereupon.

Disposed atop the substrate 11 and beneath the first sub-cell 12a is a first small area electrode 14. The electrode 14 is referred to as being of "small area" because it (1) defines the surface area of the bottom surface of the small area photovoltaic segment 10, and (2) covers a surface area substantially smaller than the surface area covered by the large area photovoltaic cell of the instant invention. The first small area electrode 14 is formed of an electrically conductive material and provides electrical access to the thin film semiconductor layers deposited thereatop, said semiconductor layers comprising the remainder of the small area segment 10. Accordingly, the electrode 14 is preferably formed of a material exhibiting high electrical conductivity, i.e. a metal. However, in some applications a transparent electrode material will be favored; as for example, when the substrate 11 is transparent and the small area photovoltaic segments 10 are adapted to be illuminated through the substrate. It will be noted that while a major portion 14b (see FIGS. 1 and 3) of the first electrode 14 is covered by the semiconductor layers of the first sub-cell 12a, the minor portion 14a of that first electrode 14 is left exposed. This has been done in accordance with the principles of the instant invention to allow for series interconnection of the small area photovoltaic segments 10 which form the improved large area photovoltaic cell described herein.

The sub-cells 12a, 12b and 12c are stacked atop the major portion 14b of the electrode 14. Each of the sub-cells 12a, 12b and 12c are fabricated with an amorphous semiconductor body containing, in the preferred embodiment, at least a silicon or germanium alloy. Each of the semiconductor bodies includes an n-type conductivity semiconductor layer 20a, 20b and 20c; an intrinsic semiconductor layer 18a, 18b and 18c; and a p-type conductivity semiconductor layer 16a, 16b and 16c. As illustrated, sub-cell 12b is an intermediate sub-cell and, as indicated in FIG. 1, additional intermediate sub-cells may be stacked atop the illustrated sub-cells without departing from the spirit or the scope of the present invention.

Atop the uppermost sub-cell 12c a second small area electrode 22 is deposited. In the preferred embodiment, the small area photovoltaic segment 10 is adapted to be illuminated from the top surface thereof (i.e., in the direction of arrow A in FIG. 1), and therefore the second electrode 22 is formed from a light transmissive, electrically-conductive material such as indium tin oxide. Note, however, that a metallic electrode material may be employed if the small area segment 10 is to be illuminated from the substrate side thereof. A high conductivity pattern in the form of a current collecting grid 24 may be optionally applied atop the transparent conductive oxide layer 22 of the small area segment to decrease resistance to flow of electrical current if the small area segment is of sufficiently large area, or if the electrical conductivity of the transparent conductive oxide electrode layer 22 is insufficient. The grid 24 shortens the carrier path through the transparent conductive oxide of the second electrode layer 22, thereby increasing the conduction efficiency. Although the term "small area photovoltaic segment" has been applied to the structure illustrated in FIG. 1, it should be noted that the small area segment 10 is a photovoltaic cell. The first electrode 14, the semiconductor layers 16a, 18a, 20a, 16b, 18b, 20b, 16c, 18c, 20c and the second electrode 22 cooperate to form said small area photovoltaic cell. The term "photovoltaic segment" has been utilized to describe this small area cell to distinguish it from the "large area photovoltaic cell" which is used herein to refer to the improved large area cell which is divided into the plurality of series-parallel connected small area segments in accordance with the principles of the instant invention.

While the small area segment 10 illustrated in FIG. 1 is a stacked assembly of p-i-n type photovoltaic subcells, the instant invention is obviously not limited to that structure, but may be utilized with photovoltaic segments of any configuration, provided they are capable of producing photo-generated electrical current. For example, the semiconductor layers of the small area photovoltaic segment 10 could be replaced with layers having an n-i-p configuration, a p-n configuration, an n-p configuration, a Schottky barrier, combinations thereof or any other photovoltaic structure known to those skilled in the art.

II. The Large Area Photovoltaic Cell

Figure 2A:
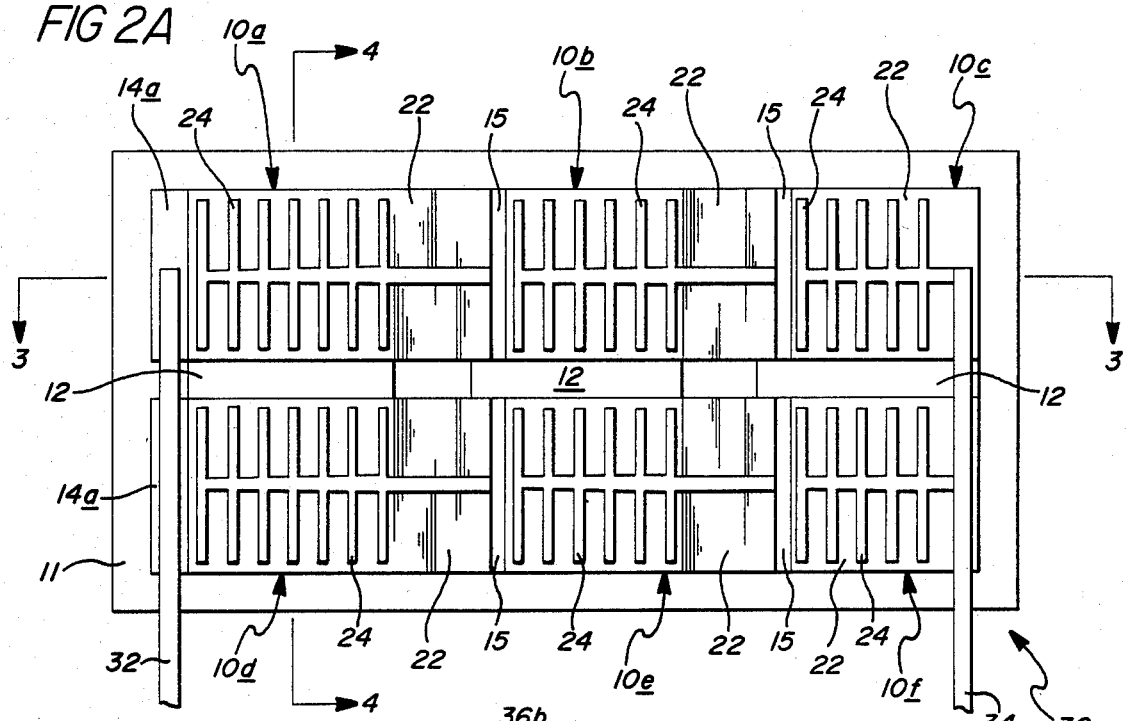
FIG. 2 illustrates a top plan view of a large area photovoltaic cell which is divided into a plurality of the small area segments of FIG. 1, said small area segments electrically connected in the series-parallel arrangement of the instant invention.
FIG. 2B is a circuit diagram illustrating the manner in which a low resistance current path through one of the small area segments of FIG. 2A is effected by the series-parallel electrical connection of the instant invention.

FIG. 2A illustrates, in plan view, a large area photovoltaic cell 30 structured in accordance with the principles of the instant invention. The large area cell 30 includes a plurality of small area photovoltaic segments 10a–10f interconnected in a series-parallel arrangement. For the sake of clarity of explanation and simplicity of illustration the large area cell 30 illustrated in FIG. 2A is shown as divided into six small area segments while in reality a larger number of small area segments are generally preferred. However, the principles of operation of the instant invention can be fully explained with reference to the abbreviated structure of FIG. 2A, the principles being equally applicable to large area photovoltaic cells comprised of a few or a great many small area segments.

Each small area photovoltaic segment 10a–10f is generally similar to the small area segment 10 illustrated in FIG. 1, although it is worth repeating that the photovoltaic device may be structured as any known device which is adapted to generate current in response to illumination. The small area segments of the large area cell 30 are disposed upon an insulating substrate 11, as previously described. Each small area segment includes an upper second small area electrode 22 forming one terminal of each small area segment. In this embodiment, a large area photovoltaic cell 30 is adapted for illumination from the second electrode side, and accordingly, these electrodes 22 are formed of a transparent conductive oxide material such as indium oxide. Immediately beneath the second electrode 22 of the small area segments 10 is the active semiconductor body 12. It is a notable feature of this invention that a separate semiconductor body 12 need not be provided for each small area segment, but rather, a single semiconductor body generally referred to herein as a bridge of semiconductor material may span the schism which exists between two or more small area segments within a given row of the large area photovoltaic cell. As will be noted from a perusal of FIG. 2A, portions of the semiconductor bridge 12 are visible between adjacent pairs of small area segments, such as between small area segments 10a–10d, 10b–10e, 10c–10f, thereby forming the three columns of the illustrated large area photovoltaic cell 30. Each small area segment also includes a lower, first, small area electrode 14 disposed between the substrate 11 and the bridge of semiconductor material 12.

The first small area electrode 14 and the second small area electrode 22 are of generally similar dimensions although they are laterally offset slightly relative to one another to provide for the electrical interconnection, in series, of the small area segments 10, said interconnection explained in detail hereinbelow. Because of this lateral offset, a small portion of the exposed surface of the first electrode 14, referred to herein as the minor portion 14a, is not covered by semiconductor material and hence is visible in the plan view of the large area photovoltaic cell 30 shown in FIG. 2A.

Each small area segment 10a–10f may also include a grid pattern 24 operatively disposed atop the second small area electrode 22. The grid pattern 24 is formed of a high conductivity material, such as a metal, and serves to shorten the current pattern through the transparent conductive oxide layer 22, thereby decreasing the internal resistance to the flow of current through the large area photovoltaic cell 30. The grid pattern may be formed by any method well known in the art; for example, a silver paste may be silk screened onto the small area segments of the large area cell in a desired pattern, or electroplating may be utilized to deposit a metallic grid pattern thereonto.

The small area segments 10a–10f into which the large area photovoltaic cell 30 is divided, are arrayed in rows and columns; small area segments 10a, 10b and 10c form one row, while small area segments 10d, 10e and 10f form a second row. The small area segments 10 in each row are electrically connected in series, as will be described in greater detail hereinbelow, and then the two rows of series connected small area segments are electrically connected in parallel by bus bars 32 and 34. The first bus bar 32 contacts the exposed minor portions 14a of the first electrode of small area segments 10a and 10d, while the second bus bar 34 contacts the second electrodes 22 of small area segments 10c and 10f. In this manner, the two rows of series connected small area segments 10 are electrically connected in parallel. If the large area photovoltaic cell 30 includes a greater number of rows of series connected small area segments 10, those rows would be similarly contacted and electrically connected by the bus bars 32 and 34.

Figure 2B:
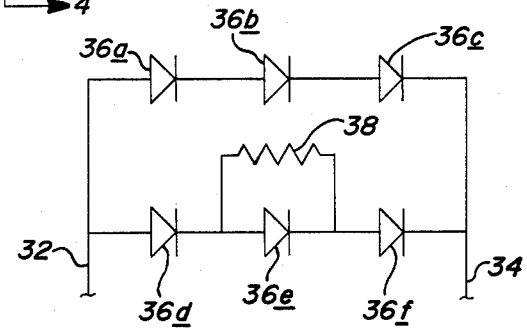

FIG. 2B represents a circuit diagram which is a model for explaining the electrical behavior of the large area photovoltaic cell 30 illustrated in FIG. 2A. The individual small area photovoltaic segments 10a–10f are represented by photovoltaic diodes 36a–36f. Diodes 36a–36c represent the first row of series connected small area segments 36a–36c, while diodes 36d–36f represent the second row of series connected small area segments 36d–36f. The two series connected rows of diodes 36a–36c and 36d–36f are electrically connected in parallel by the bus bars 32 and 34. With the foregoing description in mind, the operation of the large area photovoltaic cell 30 may now be explained with reference to the circuit diagram of FIG. 2B. A low resistance current path, such as a short or shunt defect, can be represented as a resistance in parallel with one of the photovoltaic diodes 36. For example, the photovoltaic diode 36e, which generally corresponds to small area segment 10e of FIG. 2A, is shown as having a resistor 38 placed in parallel therewith. The resistor 38 thus provides a low resistance current path around the photovoltaic diode 36e. Because of the low resistance, the small area segment 10e represented by the photovoltaic diode 36e is unable to contribute voltage or current to the second row of small area segments. In other words, the total electrical output of the second row of small area segments is supplied by the photovoltaic diodes 36d and 36f, and therefore, the total output voltage of the second row of small area segments will be approximately one third lower than that of the first row of small area segments. Since the two rows of small area segments are electrically connected in parallel, the net effect of the low resistance current path upon the total output voltage of the large area cell will be less significant than if the first and second rows of small area segments were electrically connected in series. More particularly, the loss in output voltage due to low resistance current paths will be proportional to the number of defective small area segments. As the model is extrapolated to represent an entire large area photovoltaic cell 30, it will be understood that a large number of rows of series connected small area segments are present, and accordingly, a reduction in the output voltage of only one or two rows will have a negligible effect upon the output voltage of the total number of series connected rows of small area cells which form the large area photovoltaic cell.

Figure 3:
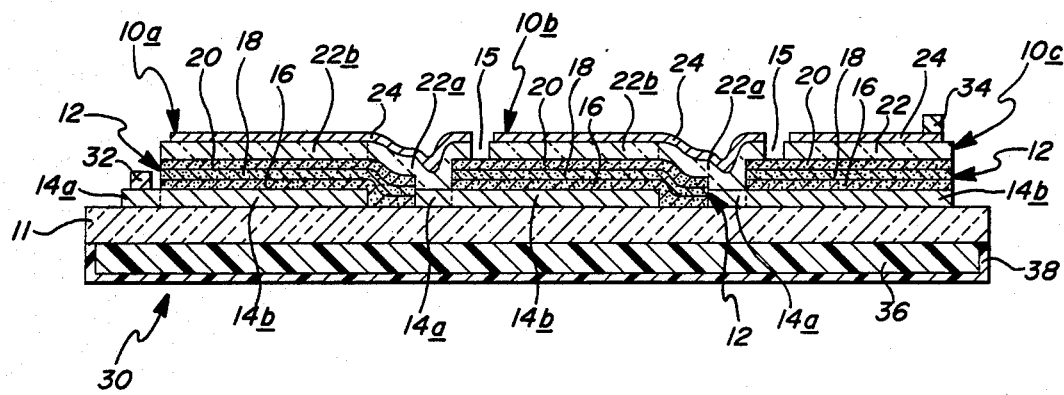
FIG. 3 is a cross-sectional view taken along line 3—3 of FIG. 2A illustrating the manner in which the second electrode of one column of small area segments overlays and electrically interconnects the adjacent small area segment in the adjacent column.

Referring now to FIG. 3, a cross-sectional view taken along line 3—3 of FIG. 2A illustrates the electrically connected rows of small area segments of the large area photovoltaic cell 30. Shown in cross-section is the insulating substrate 11 and three series connected small area photovoltaic segments 10a–10c disposed thereupon. Each of the small area segments includes a first small area electrode 14, layers of semiconductor material 12, a second small area electrode 22, and a grid pattern 24. As previously discussed and as further noted from FIG. 3, the first electrode 14 and the second electrode 22 are both similarly sized, but are generally laterally offset relative to one another. More specifically, while a major portion of the first electrode 14b and a major portion of the second electrode 22b are generally coextensive, each of the electrodes include minor portions 14a and 22a, respectively, which are adapted to effect electrical connections between adjacent small area segments.

In order to establish a series connection of the adjacent small area segments 10a–10c in the first row, it is necessary that the second small area electrode 22 of the first small area segment 10a be electrically connected to the first small area electrode 14 of the second small area segment 10b, which small area segment 10b, in turn, has its second small area electrode 22 electrically connected to the first small area electrode 14 of the third small area segment 10c. In the embodiment of the instant invention illustrated in FIG. 3, such a series connection is established by depositing the second electrode 22 of a first small area segment 10a so that the minor portion 22a thereof overlaps and establishes electrical contact with the minor portion 14a of the first electrode 14 of the adjoining small area segment 10b. The second electrode 22 of the second small area segment 10b is likewise deposited so that the minor portion thereof 22a overlaps and establishes electrical contact with the minor portion 14a of the first electrode of the adjoining third small area segment 10c. In this manner series electrical connection of the first row of small area segments 10a, 10b, and 10c is established. It should be noted that care must be taken to prevent the second electrode 22 of a given small area segment (for example 10a) from electrically contacting the second electrode 22 of the adjoining series connected small area segments (for example 10b).

Such electrical contact may be prevented by any method well known to those skilled in the art, as for example, by the use of deposition masks to restrict deposition of the second electrode 22, or by the use of electrical resist material to prevent such electrical contact.

In the illustrated embodiment, the second electrodes 22 are deposited without regard for the prevention of spurious electrical contact, and the device is then scribed to create a channel 15, which electrically isolates the electrode segments. It will also be noted from an inspection of the figure, that the semiconductor material 12 "fills in" the spaces between the first electrodes 14 of adjoining series connected small area segments (e.g. 10a and 10b). While such contact is not essential for the operation of the instant invention, it is notable that no adverse electrical effects result from such contact. The lateral electrical resistivity of the semiconductor material is relatively high therefore, a spacing of approximately 1 mil between the first electrodes 14 of the segments 10 is sufficient to render them electrically isolated, even though they are both in contact with a common semiconductor layer.

In an alternative embodiment of the instant invention, electrical contact is established between the adjacent small area segments by means of an electrical conductor which extends from the second electrode 22 of a first small area segment to the minor portion 14a of the first electrode 14 of an adjacent small area segment. Such electrical conductors may take the form of metallic wires or foils, or be vacuum deposited or electroplated metallic members.

Also shown in FIG. 3 is the first bus bar 32 which electrically contacts the minor portion 14a of the first electrode of the first small area segment 10a, and the second bus bar 34 which electrically contacts the second electrode 22 of the third small area segment 10c. It should be noted that the specific arrangement of the bus bars, described hereinabove, is not required by the concepts disclosed in the instant invention. It may be desirable in some cases to extend the second electrode 22 of that small area segment 10c to the insulating substrate 11, thereby establishing electrical contact to the bus bar 34 thereupon. Other similar modifications of the busbar system may likewise be made in keeping with the spirit of the instant invention.

FIG. 3 illustrates still another feature of the instant invention. Disposed upon the surface of the insulating substrate 11, directly opposite the surface thereof upon which the small area photovoltaic segments 10a–10c are disposed, is a layer of sealant material 36 which is retained in pressurized contact with the substrate 11 by an encapsulating layer 38. The sealant material 36 is a semisolid, electrically insulating, air and moisture resistant material such as a silicone or organic resin. In the event of puncture damage to a small area segment 10 of the large area photovoltaic cell 30, the sealant material 36 oozes through the punctured portion, effectively sealing off the edges of the puncture. In this manner electrical insulation is provided and oxidation or corrosion of the damaged edges due to exposure to ambient conditions is prevented. Use of this sealant layer 36 thereby renders the large area photovoltaic device 30 relatively insensitive to puncture damage. It may be desirable, in some cases, to mechanically affix portions of the encapsulant layer 38 to the substrate 11 by welding, gluing, riveting or some such method. In this manner, a "quilted" configuration is provided, which aids in retaining the sealant material 36 in uniform contact with the substrate 11. In a similar manner, the encapsulant layer 38 may be attached to the substrate so as to form a plurality of discrete pockets or cells which function to retain the sealant material in contact with the substrate.

Figure 4:
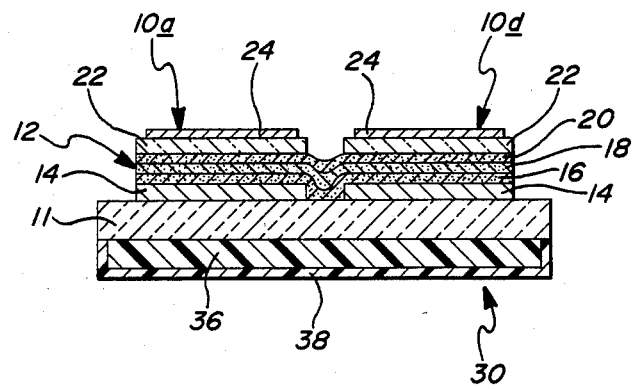
FIG. 4 is a cross-sectional view taken along line 4—4 of FIG. 2A illustrating the manner in which the semiconductor layers in one column of small area segments bridge the spacing between the adjacent small area segments.

FIG. 4 is a cross-sectional view of the large area photovoltaic cell 30 of the instant invention taken along line 4—4 of FIG. 2A, showing the sealant material 36, the encapsulant layer 38, the electrically insulating substrate 11, and two small area segments 10a and 10d as disposed in one column of the large area cell 30. The first electrodes 14 of the small area segments 10a and 10d are disposed immediately atop the insulating substrate 11. Extending across both first electrodes 14, as well as the portion of the underlying substrate material 11 therebetween, is the bridge of semiconductor material 12, which is the active photovoltaic (i.e. current generating) element of the small area segments 10a and 10d. The small area segments 10a and 10d form the series-parallel connected large area cell 30, of the instant invention. In the embodiment illustrated in FIG. 4, the semiconductor bridge 12 is shown as comprised of a p-type semiconductor layer 16, an intrinsic layer 18, and an n-type layer 20. It is a notable feature of the present invention that the semiconductor bridge 12 extends between the two first electrodes 14 of the small area segments 10a and 10d. The use of a semiconductor bridge is possible because of the relatively high lateral resistivity of the thin film semiconductor material. It should be kept in mind that the vertical dimensions in the figures have been exaggerated for purposes of illustration, and the thickness of the semiconductor bridge 12 will generally be under a micron, while the spacing between adjacent small area segments 10a and 10d will be significantly greater. Therefore, the individual small area segments of the photovoltaic cell are electrically isolated, even though common semiconductor bridges 12 are present.

It is to be understood that the foregoing description is exemplary of the instant invention, and is not meant to be a limitation thereupon. It is the following claims, including all equivalents, which define the scope of the instant invention.

What is claimed is:

1. A large area photovoltaic cell formed of a plurality of small area photovoltaic segments arranged in a plurality of rows and columns, said small area segments in each of said rows electrically connected in series; said series connected rows of small area segments electrically connected in parallel; the large area cell comprising;

a. a common electrically insulating substrate member;
   b. a plurality of discrete first small area electrodes formed on said substrate and electrically isolated from one another so as to form a plurality of rows and columns of small area electrodes; each first electrode having a surface divided into a major portion adapted to have semiconductor material deposited thereupon, and a minor portion adapted to be in electrical contact with a second electrode;
   c. a discontinuous layer of semiconductor material adapted to generate an electrical current in response to illumination thereof, said discontinuous layer disposed on said plurality of discrete small area electrodes; said discontinuous layer forming a plurality of semiconductor bridges overlying the major portions of at least two adjacent first electrodes in a column and extending into portions of said substrate exposed between adjacent first electrodes in a row;
   d. a plurality of discrete small area second electrodes electrically isolated from one another so as to form a plurality of rows and columns of small area second electrodes, each second electrode generally corresponding to and overlying the major portion of one of the underlying first electrodes; each second electrode electrically contacting (1) one of the semiconductor bridge portions extending onto said substrate between adjacent first electrodes in a row, and (2) the minor portion of the adjacent first electrode so as to series-connect each of said rows of small area photovoltaic segments; and
   e. parallel connection means electrically connecting in parallel said rows of small area photovoltaic segments electrically connected in series; whereby a series-parallel connected large area photovoltaic cell exhibiting only proportional performance losses resulting from failures of small area photovoltaic segments thereof is provided.

2. A large area photovoltaic cell as in claim 1, wherein the discontinuous layer of semiconductor material includes at least one layer of an amorphous silicon alloy material.

3. A large area photovoltaic cell as in claim 1, wherein the discontinuous layer of semiconductor material includes at least one layer of an amorphous germanium alloy material.

4. A large area photovoltaic cell as in claim 1, wherein the discontinuous layer of semiconductor material includes a layer of p-type semiconductor material, a layer of i-type semiconductor material generally coextensive with the layer of p-type material, and a layer of n-type semiconductor material generally coextensive with the layer of i-type semiconductor material.

5. A large area photovoltaic cell as in claim 1, wherein the electrically insulating substrate member is formed essentially of a material chosen from the group consisting of: glass, organic polymers, and metal coated with organic polymers.

6. A large area photovoltaic cell as in claim 1, wherein the parallel connection means includes a plurality of electrically conductive bus bars disposed upon the large area photovoltaic cell.

7. A large area photovoltaic cell as in claim 1, further including:
   sealing means for electrically and environmentally isolating punctured portions of the large area cell from ambient conditions, whereby said cell is rendered resistant to the effect of puncture damage.

8. A photovoltaic cell as in claim 7, wherein the sealing means comprises a layer of sealant material disposed upon a surface of the elecrically insulating substrate opposite the surface thereof upon which the first electrodes are disposed, said sealant material maintained in pressurized contact with the substrate by an encapsulating member, whereby creation of a puncture in the substrate layer will cause the sealant materials to flow and seal the puncture.

9. A photovoltaic cell as in claim 8, wherein the sealant material consists essentially of a material chosen from the group consisting of: silicone resins, organic resins, rubber, and combinations thereof.

10. A method of manufacturing a large area photovoltaic cell formed of a plurality of small area photovoltaic segments arranged in a plurality of rows and columns, said small area segments in each of said rows electrically connected in series; said series connected rows of small area segments electrically connected in parallel; the method including the steps of;

a. providing an electrically insulating substrate member;

b. forming a plurality of rows and columns of discrete first small area electrodes upon the electrically insulating substrate member; said first small area electrodes electrically isolated from one another, and each first electrode having a surface divided into a major portion adapted to have semiconductor material deposited thereupon, and a minor portion adapted to be in electrical contact with a second electrode;

c. providing a plurality of semiconductor bridges dispoed on and overlying the major portions of at least two adjacent first electrodes in a column and extending into portions of said substrate exposed between adjacent first electrodes in a row; said semiconductor bridges formed of a semiconductor material adapted to generate an electrical current in response to illumination thereof;

d. providing a plurality of discrete small area second electrodes electrically isolated from one another, so as to form a plurality of rows and columns of small area second electrodes, each second electrode generally corresponding to, and overlying the major portion of one of the underlying first electrodes; each second electrode disposed so as to electrically contact (1) one of the semiconductor bridge portions extending onto said substrate between adjacent first electrodes in a row, and (2) the minor portion of the adjacent first electrode so as to series-connect each of said rows of small area photovoltaic segments; and e. electrically connecting in parallel said rows of small area photovoltaic segments electrically connected in series, whereby a series-parallel connected large area photovoltaic cell exhibiting only proportional performance losses resulting from failures of photovoltaic segments thereof is provided.

11. A method as in claim 10 comprising the further step of: providing sealing means for electrically and environmentally isolating punctured portions of the cell from ambient conditions.

12. A method as in claim 11 wherein the step of providing sealing means comprises providing a layer of sealant material upon a surface of the electrically insulating substrate opposite the surface thereof upon which the first electrodes are disposed; and, maintaining said sealant material in pressurized contact with the substrate by means of an encapsulating member, whereby creation of a puncture in a substrate layer will cause the sealant material to flow through and seal the puncture.

13. A method as in claim 12 wherein the step of providing a layer of sealant material includes selecting the sealant material essentially from the group consisting of: silicone resins, organic resins, rubber and combinations thereof.

14. A method as in claim 10, wherein the step of providing an electrically insulating substrate comprises the step of providing an elongated web of electrically insulating substrate material, the method including the further step of:

continuously advancing the elongated web through a coating station adapted to provide said plurality of semiconductor bridges.

15. A method as in claim 14, wherein the step of continuously advancing the elongated web through the coating station comprises:

continuously advancing the elongated web through a glow discharge deposition apparatus.

* * * * *